United States Patent
Richter

(10) Patent No.: US 7,218,569 B2
(45) Date of Patent: May 15, 2007

(54) MEMORY CIRCUIT, AND METHOD FOR READING OUT DATA CONTAINED IN THE MEMORY CIRCUIT USING SHARED COMMAND SIGNALS

(75) Inventor: Michael Richter, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 99 days.

(21) Appl. No.: 11/135,212

(22) Filed: May 23, 2005

(65) Prior Publication Data

US 2005/0270884 A1    Dec. 8, 2005

(30) Foreign Application Priority Data

May 21, 2004   (DE) .................. 10 2004 024 942

(51) Int. Cl.
| | |
|---|---|
| G11C 8/00 | (2006.01) |
| G11C 7/10 | (2006.01) |
| G11C 7/00 | (2006.01) |
| G06F 12/00 | (2006.01) |

(52) U.S. Cl. .................. 365/230.03; 365/189.02; 365/191; 365/230.02; 365/230.06; 711/105; 711/156

(58) Field of Classification Search .......... 365/189.02, 365/230.02, 230.03

See application file for complete search history.

(56) References Cited

U.S. PATENT DOCUMENTS

| | | | | |
|---|---|---|---|---|
| 5,455,916 A | * | 10/1995 | Bourke et al. | ............. 710/105 |
| 6,381,685 B2 | | 4/2002 | Dell et al. | |
| 2001/0003198 A1 | * | 6/2001 | Wu | ............. 711/104 |
| 2003/0110368 A1 | * | 6/2003 | Kartoz | ............. 713/1 |
| 2003/0185082 A1 | * | 10/2003 | Schnell | ............. 365/225.7 |
| 2003/0204674 A1 | * | 10/2003 | Ryan et al. | ............. 711/137 |
| 2004/0205433 A1 | * | 10/2004 | Gower et al. | ............. 714/733 |
| 2004/0257847 A1 | * | 12/2004 | Matsui et al. | ............. 365/63 |
| 2005/0162948 A1 | * | 7/2005 | Swanson et al. | ............. 365/201 |

FOREIGN PATENT DOCUMENTS

DE   19952947 A1   5/2001

* cited by examiner

*Primary Examiner*—Huan Hoang
*Assistant Examiner*—Ly Duy Pham
(74) *Attorney, Agent, or Firm*—Patterson & Sheridan, L.L.P.

(57) ABSTRACT

The present invention relates to a memory circuit having a memory cell array for storing data, and having a command decoding circuit for receiving command signals, and having a setting memory for storing an item of operating information that is specific to a memory circuit, the command decoding circuit performing a function in the memory circuit on the basis of applied drive commands, wherein the command decoding circuit is configured in such a manner that, during an initialization mode, the operating information can be read out on the basis of a predetermined drive command that is supplied to the command decoding circuit, and in such a manner that, during a normal operating mode, a function that is different therefrom can be performed with the aid of the predetermined drive command.

22 Claims, 2 Drawing Sheets

| NAME | | $\overline{RAS}$ | $\overline{CAS}$ | $\overline{WE}$ |
|---|---|---|---|---|
| NO OPERATION | | H | H | H |
| ACTIVE | | L | H | H |
| READ | | H | L | H |
| WRITE | | H | L | L |
| BURST TERMINAL | | H | H | L |
| PRECHARGE | | L | H | L |
| AUTO REFRESH OR SELF REFRESH | | L | L | H |
| MODE REGISTER SET | | L | L | L |

MEMORY CIRCUIT, AND METHOD FOR READING OUT DATA CONTAINED IN THE MEMORY CIRCUIT USING SHARED COMMAND SIGNALS

CROSS-REFERENCE TO RELATED APPLICATIONS

This application claims foreign priority benefits under 35 U.S.C. §119 to co-pending German patent application number DE 10 2004 024 942.3, filed 21 May 2004. This related patent application is herein incorporated by reference in its entirety.

BACKGROUND OF THE INVENTION

1. Field of the Invention

The invention relates to a memory circuit and to a method for reading out a specific item of operating information contained in a memory circuit.

2. Description of the Related Art

In memory circuits, in particular in SDRAM (synchronous dynamic random access memory), internal product-specific data, for example the maximum operating frequency at which the memory circuit can be operated, the bus width, other optional features supported etc., are present in the memory circuit. This data cannot be read out by a memory controller that usually drives the memory circuit. This is due to the fact that the memory circuit merely has configuration registers (mode registers, extended mode registers), to which configuration data can be written, for the purpose of controlling its operation, and there is otherwise no interface or drive command (in accordance with a specification) which can be used to read out the internal product-specific data from these configuration registers.

Dynamic memory circuits, for example the SDRAM, can usually be driven using eight different drive commands which are coded with the aid of three command (control) signals. These drive commands are sufficient for normal operation of the SDRAM. However, these eight drive commands do not include a drive command for reading out internal product-specific data.

However, it is desirable, for optimized operation of the memory controller, to read out the product-specific data from the memory circuit in the form of operating information. The memory controller could thus, for example, inquire whether or not a particular memory circuit comprises a particular optional feature, for example a temperature sensor. The memory controller could then configure itself and the memory circuit in an appropriate manner on the basis of the presence of the feature.

Providing a further command for reading out the specific operating information would require the provision of a further command signal that would have to be provided using a further connection pin of the memory circuit. It has hitherto been possible, in memory circuits which are combined to form memory modules, to provide such data, for example, in a separate non-volatile memory chip that has an appropriate interface. Such a memory chip is programmed in accordance with the memory circuits used, but errors can occur if the programming does not correspond to the features of the corresponding memory circuits.

However, there is no such option in memory circuits which are used individually. In this case, the corresponding operating information required must be taken from the data sheet for the memory circuit and permanently prescribed to the memory controller.

Therefore, it is an object of the present invention to provide a memory circuit in which the specific operating information can be read out in a simple manner, in particular without having to provide additional connections or command signals. It is furthermore an object of the present invention to provide a method for reading out a specific item of operating information contained in a memory circuit.

SUMMARY OF THE INVENTION

In accordance with a first aspect of the present invention, provision is made of a memory circuit having a memory cell array for storing data, and having a command decoding circuit for receiving command signals. The memory circuit furthermore has a setting memory in which an item of operating information that is specific to the memory circuit is stored. The command decoding circuit performs a function in the memory circuit on the basis of applied drive commands (i.e., control signals). The command decoding circuit is furthermore configured in such a manner that, during an initialization mode, the operating information can be read out on the basis of a predetermined drive command that is supplied to the command decoding circuit, and in such a manner that, during a normal operating mode, a different function can be performed with the aid of the predetermined drive command. In particular, the predetermined drive command corresponds to a read command for reading out data from the memory cell array in the normal operating mode.

The memory circuit according to the invention has the advantage that identical drive commands which are applied result in different functions within the memory circuit during the initialization mode and during the normal operating mode. Whereas the predetermined drive command during the initialization mode causes the specific operating information to be read out from the setting memory, the predetermined drive command during the normal operating mode results in data, for example in accordance with an applied memory address, being read out from the memory cell array. This makes it possible to provide a further drive command without possibly having to provide a further command signal that would have to be supplied via a separate signal connection or without having to implement a further drive command in the command decoding circuit.

Such a procedure is possible because it is necessary to read out the specific operating information only once at the beginning of operation of the memory circuit and not during continuous operation, with the result that the connected memory controller receives the specific operating information and can operate the memory circuit on the basis of the specific operating information or can configure the memory circuit in a suitable manner on the basis of the specific operating information.

In particular, the command decoding circuit can assume the initialization mode after an operating voltage has been applied. This is the case, in particular, in memory circuits which do not have a reset connection for the purpose of resetting the memory circuit to a defined state.

The command decoding circuit may be configured in such a manner that it executes a sequence of a plurality of drive commands during the initialization mode.

In particular, the command decoding circuit may be configured in such a manner that, during the initialization mode, the operating information can be read out on the basis of an address that is provided on address lines when the predetermined drive command is applied.

In accordance with another aspect of the present invention, provision is made of a method for reading out a specific item of operating information contained in a memory circuit. The method provides for drive commands to be received during an initialization mode in order to perform an initialization function. In this case, the operating information is transmitted on the basis of the reception of a predetermined drive command during the initialization mode. Drive commands are likewise received during a normal operating mode, and the data which are stored in a memory cell array of the memory circuit are transmitted on the basis of the reception of the predetermined drive command during the normal operating mode.

The method according to the invention makes it possible to interpret identical drive commands differently such that, during an initialization mode, the specific operating information is output and, during a normal operating mode, another regular function of the memory circuit is performed. In particular, the predetermined drive command to be selected is such a drive command whose function is not required during the normal operating mode but is required during the initialization mode. The method according to the invention has the advantage that a specific item of operating information can be read out from the memory circuit without implementing a further drive command in the memory circuit, in particular without providing an additional signal connection to the memory circuit.

In accordance with one embodiment of the invention, provision may be made for the operating information to be transmitted, on the basis of an address that has been provided, on the basis of the reception of the drive command during the initialization mode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figures 1A, 1B:
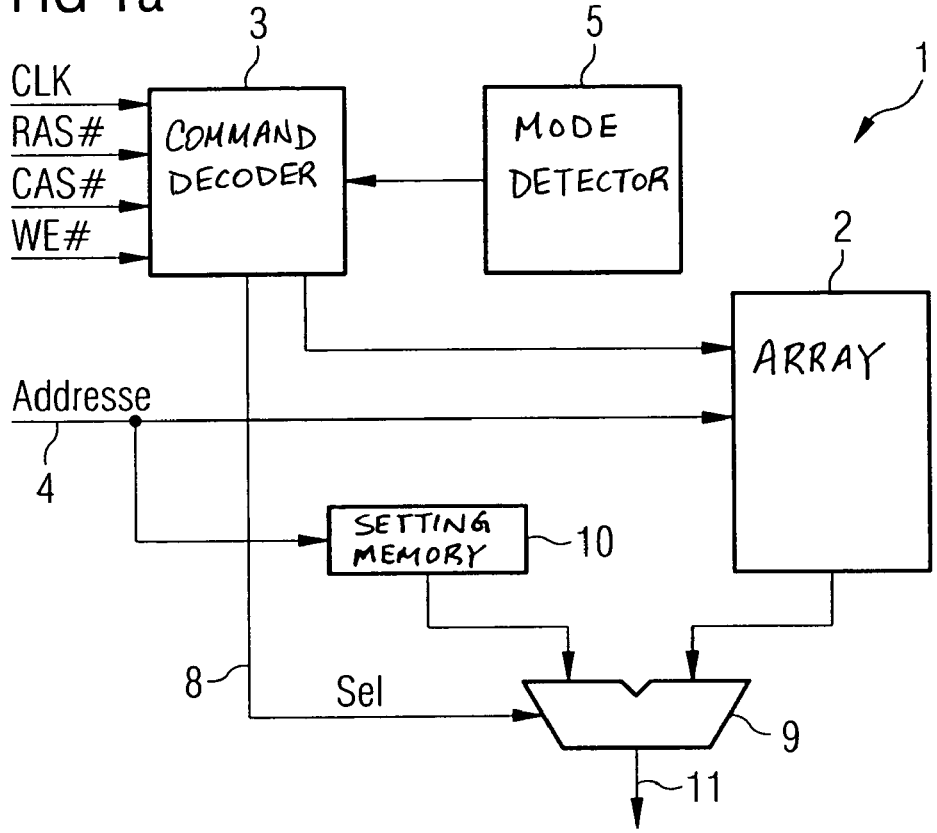
FIG. 1a shows a block diagram that schematically shows the design of a memory circuit in accordance with one embodiment of the invention.
FIG. 1b shows a table for coding drive commands with command signals.

FIG. 1a shows a block diagram of a memory circuit 1 according to the invention. The memory circuit 1 has a memory cell array 2 in which data to be read out can be stored. The memory cell array can perform certain functions which are prescribed by a command decoding circuit 3. The command decoding circuit 3 is connected to a clock signal line, to which a clock signal CLK can be applied, and to three command signal lines, to which command signals can be applied. The command signals are referred to as RAS (Row Activation Signal), CAS (Column Activation Signal) and WE (Write Enable Signal) signals. These three command signals which can respectively assume a first or a second logic state can be used to receive and execute eight commands for eight different functions of the memory cell array. The memory cell array 2 can likewise be driven via address lines 4, it being possible to perform at least some of the functions, which are prescribed by the command decoding circuit 3, on the basis of an applied address value.

The command decoding circuit 3 is furthermore connected to a mode detector 5 that indicates whether the memory circuit is in an initialization mode or in a normal operating mode. The initialization mode is used to set the memory circuit in a certain manner immediately after the memory circuit has been switched on in order to make stipulations for subsequent operation. By way of example, during the initialization mode, the memory cells are brought into a defined state, and a memory controller (not shown) that drives the memory circuit writes to configuration registers, with the result that, for example, the refresh rate of the memory cells in a dynamic memory circuit and other parameters required, for example, for time control when accessing the memory cell array, are set. Only when certain functions which are prescribed in a specification (for example the JEDEC standard) have been performed during the initialization mode, which can be detected by the mode detector 5, does the mode detector output a mode signal to the command decoding circuit 3 in order to indicate that a change is now to be made from the initialization mode to the normal operating mode. The initialization mode itself is assumed as soon as an operating voltage is applied to the memory circuit or if a reset signal has been applied for the purpose of resetting the memory circuit.

During the initialization mode, a command is not needed to read memory cells from the memory cell array. The same applies to the drive commands "no operation", "ACTIVE" (activate the row line), "WRITE" (write to a memory cell) and "BURST TERMINATE" (end burst). Coding of the individual commands is indicated in the table shown in FIG. 1b. On the basis of the applied command signals and on the basis of the applied mode signal, the command decoding circuit 3 outputs a selection signal SEL on a selection line 8, said selection signal being supplied to a multiplexer 9. The multiplexer 9 is connected to the memory cell array and to a setting memory 10 in order to output data from the setting memory 10 or from the memory cell array 2 on data lines 11 on the basis of the selection signal SEL. In the normal operating mode, the selection signal SEL drives the multiplexer 9 in such a manner that data are output from the memory cell array 2. During the initialization mode, the multiplexer 9 is switched by the selection signal SEL in such a manner that data from the setting memory 10 are applied to the output lines 11.

The setting memory 10 contains the specific operating information which is used to specify which permanent properties (which cannot be set) the memory circuit has. The specific operating information is permanently set in the memory circuit and comprises, for example, information about the maximum operating frequency, the internal bus width, further optional features supported, for example whether or not the memory circuit contains a temperature sensor, etc.

Figure 2:
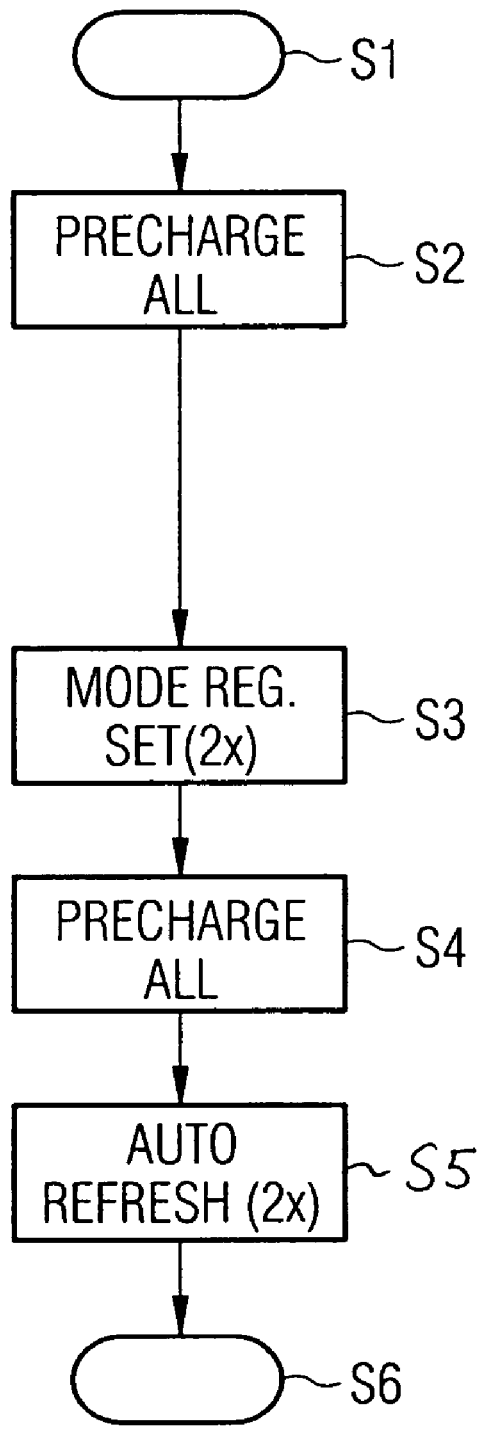
FIG. 2 shows possible command sequences for an initialization mode for a memory chip in accordance with the prior art and for a memory chip in accordance with one embodiment of the present invention.
Figure 2:
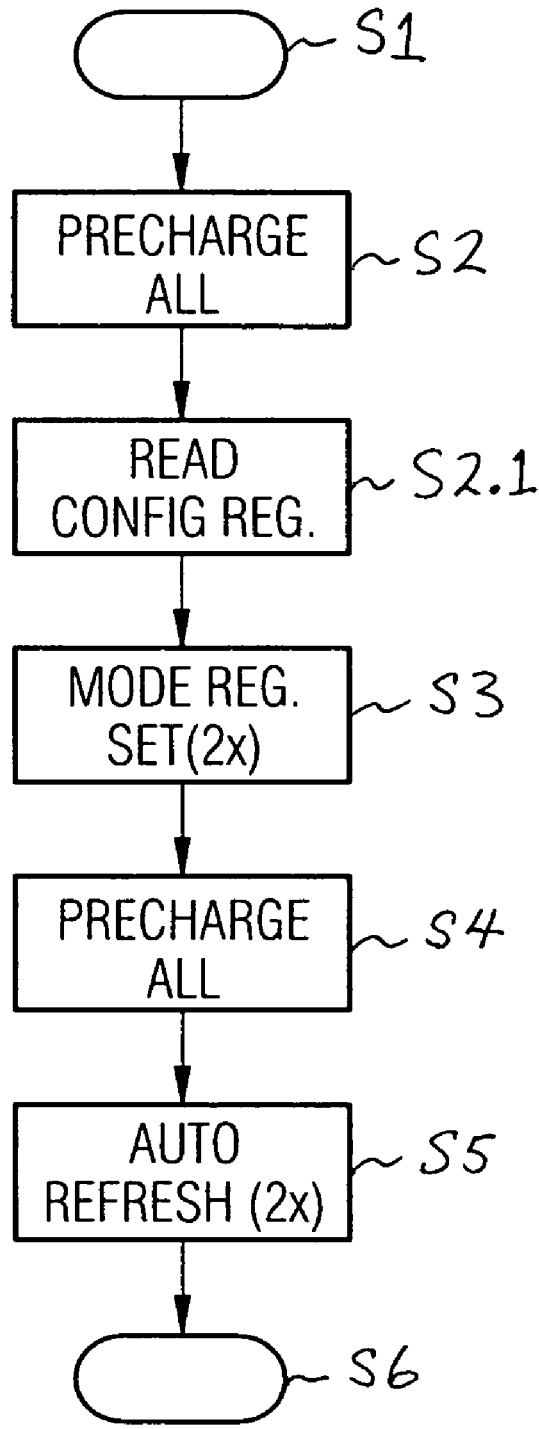

FIG. 2 illustrates a flowchart relating to the sequence of an initialization mode in accordance with a JEDEC standard. The left-hand flowchart illustrates the initialization command sequence for a memory chip in accordance with the prior art. The initialization command sequence involves assuming the initialization mode after a supply voltage has been applied in step S1. As specified, the drive commands as shown in FIG. 1b are then called. In this case, the potential of all bit lines in the memory cell array is defined (step S2) with the aid of the drive command "PRECHARGE ALL". A mode register is then set twice (with the aid of the "MODE REGISTER SET" command) in order to write configuration data, which prescribe parameters for operating the memory circuit, to the mode registers. These configuration data can be prescribed, for example, using the address lines.

The bit lines are then precharged once again ("PRECHARGE ALL" command) in order to define their potential (step S4). After the bit lines have been precharged, all of the memory cells are refreshed twice ("AUTO-REFRESH" command) in order to bring them to a defined state (Step S5). A change is then made to the normal operating mode in accordance with step S6.

The right-hand flowchart shown in FIG. 2 shows a novel command sequence that essentially comprises the command sequence for memory circuits in accordance with the prior art and likewise satisfies the JEDEC standard. It differs as a result of the fact that a read command for reading the setting memory 10 is applied (Step S2.1) between the operation of precharging the bit lines in accordance with step S2 and the operation of setting the mode registers in accordance with step S3 by applying a predetermined drive command, in particular the drive command ("READ") for reading the memory cell array 2, during normal operation, said drive command being interpreted as a read command for the setting memory 10 during the initialization mode. This makes it possible for the memory controller to obtain specific operating information for the connected memory circuit and, on the basis of the specific operating information, to write configuration data in accordance with the specific operating information to the mode register in the following step of setting the mode register. This makes it possible to provide standard memory controllers for various memory circuits since the memory circuits are identified in accordance with their specific operating information, and the memory controller knows, after receiving the specific operating information, how the connected memory circuit is to be operated.

While the foregoing is directed to embodiments of the present invention, other and further embodiments of the invention may be devised without departing from the basic scope thereof, and the scope thereof is determined by the claims that follow.

What is claimed is:

1. A method for reading operating information out of a memory device used to specify properties of the memory device, comprising:
   during a first mode of operation of the memory device:
      receiving a combination of command signals;
      on the basis of the received combination of command signals,
   performing a first operation comprising reading the operating information out of a first memory area of the memory device; and
   during a second mode of operation of the memory device:
      receiving the same combination of command signals; and
         on the basis of the received same combination of command signals, performing a second operation comprising reading information out of a second memory area of the memory device, wherein the first and second memory areas are exclusive of each other.

2. The method of claim 1, further comprising:
   during the first mode of operation of the memory device:
      decoding the combination of command signals to produce a decoded command; and
   during the second mode of operation of the memory device:
      decoding the combination of command signals to produce the decoded command.

3. The method of claim 1, wherein the second operation is exclusive of reading the operating information out the memory device.

4. The method of claim 1, wherein the first mode is an initialization mode and the second mode is a normal operation mode.

5. The method of claim 1, further comprising, on the basis of which mode the memory device is operating in, selecting different address space from which to read out of.

6. The method of claim 5, wherein selecting different address space from which to read out of comprises operating a multiplexer responsive to the mode of operation.

7. The method of claim 1, wherein the information is operating information specific to the memory device.

8. A method for reading operating information out of a memory device used to specify properties of the memory device, comprising:
   during an initialization mode of operating the memory device:
      receiving a combination of command signals;
      decoding the combination of command signals to produce a decoded command;
      on the basis of the decoded command, performing a first operation comprising reading the operating information out of a first memory area of the memory device;
   changing from the initialization mode to a normal operating mode; and
   during the normal operating mode of operation of the memory device:
      receiving the combination of command signals;
      decoding the combination of command signals to produce the decoded command; and
      on the basis of the decoded command, performing a second operation comprising reading information out of a second memory area of the memory device, wherein the first and second memory areas are exclusive of each other.

9. The method of claim 8, wherein the decoded command is a read command for reading out data in the normal operating mode.

10. The method of claim 8, wherein the decoding is done by a command decoder; and wherein changing from the initialization mode to the normal operating mode comprises receiving, by the command decoder, a signal issued by a mode detector configured to detect completion of predetermined functions of the initialization mode.

11. The method of claim 8, wherein during the initialization mode output data lines are coupled to a first memory area of the memory device containing the information read out during the first operation and wherein changing from the initialization mode to the normal operating mode comprises decoupling the data lines from the first area and coupling the data lines to a second area of the memory device.

12. The method of claim 8, wherein the second operation is exclusive of reading the operating information out the memory device.

13. The method of claim 8, wherein the information is operating information specific to the memory device.

14. The method of claim 13, further comprising, after reading the information out the memory device, writing the information to a mode register of the memory device.

15. An memory device, comprising:
a first memory area for storing first data;
a second memory area for storing second data; and
a command decoder for receiving and decoding command signals and outputting corresponding commands; wherein, while in a first mode of operation, the command decoder is configured to receive and decode a set of predetermined command signals to output a predetermined command causing the first data to be read out of the first memory area, and, while in a second mode of operation, the command decoder is configured to receive and decode the set of predetermined command signals causing the second data to be read out of the second memory area.

16. The memory device of claim 15, wherein the first data is operating information specific to the memory device and the second data is general-purpose data.

17. The memory device of claim 16, further comprising a controller configured to receive the operating information and configured to operate the memory device on the basis of the received operating information.

18. The memory device of claim 15, further comprising a mode selector configured to apply a mode selection input to the decoder causing the mode of operation to change from the first mode to the second mode.

19. The memory device of claim 18, wherein the mode selector is configured to apply the mode selection input upon detecting completion of predetermined functions of the first mode.

20. The memory device of claim 15, further comprising a multiplexer configured to select between outputting on a data bus data from the first memory area and the second memory area, depending on the mode of operation.

21. The memory device of claim 15, further comprising:
a mode selector configured to apply a mode selection input to the decoder causing the mode of operation to change from the first mode to the second mode;
a multiplexer configured to select between outputting on a data bus data from the first memory area and the second memory area, depending on the mode of operation.

22. The memory device of claim 21, wherein the multiplexer is coupled to the command decoder and is configured to be operated in response to a selection signal received from the command coder, the selection signal being output in response to the mode selection input of the mode selector.

* * * * *